US006510398B1

(12) United States Patent
Kundu et al.

(10) Patent No.: US 6,510,398 B1
(45) Date of Patent: Jan. 21, 2003

(54) CONSTRAINED SIGNATURE-BASED TEST

(75) Inventors: Sandip Kundu, Austin, TX (US); Sanjay Sengupta, San Jose, CA (US); Rajesh Galivanche, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 152 days.

(21) Appl. No.: 09/599,676

(22) Filed: Jun. 22, 2000

(51) Int. Cl.[7] .............................................. G06F 11/00
(52) U.S. Cl. ...................... 702/117; 702/118; 702/119; 702/120; 702/183; 702/185; 702/189
(58) Field of Search ........................... 702/71, 108, 117, 702/118, 119, 120, 123, 124, 126, 183, 185, 189, FOR 102, FOR 104, FOR 134, FOR 135, FOR 170, FOR 171; 714/726, 728, 732, 735, 736, 738, 739, 819, 5, 10, 30, 744, 763; 365/200, 201, 189.12, 205; 324/763, 764, 765

(56) References Cited

U.S. PATENT DOCUMENTS

| | | | | |
|---|---|---|---|---|
| 4,510,572 A | * | 4/1985 | Reece et al. ............. 364/73 AT |
| 4,628,531 A | * | 12/1986 | Okamoto et al. ............... 382/8 |
| 5,001,713 A | * | 3/1991 | Whetsel ...................... 371/22.3 |
| 5,084,874 A | * | 1/1992 | Whetsel, Jr. ................ 371/22.3 |
| 5,103,450 A | * | 4/1992 | Whetsel ...................... 371/22.1 |
| 5,173,906 A | * | 12/1992 | Dreibelbis et al. ......... 371/22.5 |
| 5,617,531 A | * | 4/1997 | Crouch et al. ......... 395/183.06 |
| 5,696,771 A | * | 12/1997 | Beausang et al. .......... 371/22.3 |
| 5,757,815 A | * | 5/1998 | Shimogama ............... 371/21.1 |
| 5,983,377 A | * | 11/1999 | Knotts ......................... 714/726 |
| 5,987,632 A | * | 11/1999 | Irrinki et al. ................ 714/711 |
| 6,067,650 A | * | 5/2000 | Beausang et al. ........... 714/726 |
| 6,085,334 A | * | 7/2000 | Giles et al. ..................... 714/7 |

* cited by examiner

*Primary Examiner*—Marc S. Hoff
*Assistant Examiner*—Carol S Tsai
(74) *Attorney, Agent, or Firm*—Schwegman, Lundberg, Woessner & Kluth, P.A.

(57) ABSTRACT

A test system for structurally testing an integrated circuit device includes a pattern generator for generating successive random data patterns (scan chain). The test system further includes a constraint checker and corrector module, coupled to the pattern generator, to replace undesirable random data patterns (state elements joined together in the scan chain such that one state element is connected to a ground and the other state element is connected to a power supply) with desirable bit sequences to eliminate bus contention problems in the generated random data patterns. The test system further includes the integrated circuit device to be tested. The integrated circuit device receives the constrained random data patterns from the constraint checker and corrector module and outputs a test result. The test system further includes an X-masking module coupled to the integrated circuit device. The X-masking module receives the test result from the integrated circuit device, and it masks the test result by replacing unpredictable bit values (these are bit values generated due to not scanning some state elements in the scan chain) in the test result with predictable bit values. A signature analyzer coupled to the X-masking module receives the masked test result and compress the test result into a signature. Then a comparator coupled to the signature analyzer compares the signature with a predetermined test result to determine the functionality of the integrated circuit device.

31 Claims, 2 Drawing Sheets

CONSTRAINED SIGNATURE-BASED TEST

TECHNICAL FIELD

This invention relates generally to integrated circuit devices, and more particularly, to structural testing of integrated circuit devices.

BACKGROUND

Testing of integrated circuit die or a packaged component including circuitry (generally referred to as a device under test (DUT)) at the time they are manufactured and before they are incorporated into a next level assembly is generally necessary to ascertain the functionality of the DUT. A microprocessor, for instance, should be tested before it is incorporated into a next level assembly to avoid the cost of discarding the microprocessor, or to avoid a costly diagnosis and repair after it is assembled into the next level assembly.

Traditionally, microprocessors and integrated circuit devices have been subjected to functional testing using an external tester. These external testers contain a large memory that stores test data patterns of ones and zeros used as inputs to the microprocessor along with patterns of correct outputs expected from the microprocessor. The drawback of functional testing is that the external tester performance has to keep up with microprocessor performance improvements, and the writing of test data patterns for functional testing can take as much as 60 to 100 man-years. Also the functional testing generally increases tester data volume and application time. To circumvent the problem of increased tester data volume and application time, a special test mode is designed into the microprocessor circuitry. When this mode of operation is selected, the internal state of nodes in the microprocessor circuitry can be accessed, initialized and controlled directly from the tester without having to run through the functional inputs and outputs that are used in normal operation mode. This type of test mode to test the microprocessor accomplishes the testing of the structure of the microprocessor and not the whole function of the microprocessor. Testing the microprocessor using the special test mode is generally known as "structural testing". Structural testing can considerably reduce the test data volume and test application time, and it permits using automatic tools to program the tester, which in turn reduces the time required to write test data patterns.

Further simplification and reduction in testing costs are obtained by using Built-In Self-Test (BIST) methodology. BIST uses random data patterns to test the DUT in the test mode (when using random data patterns in the test mode, the state elements are configured in a long daisy chain, such that the test data moves serially from one state element to another, and eventually the test data comes out of an external pin in the DUT). The term "state elements" in this document refers to essentially a part of the microprocessor circuit that potentially holds data for at least one clock cycle. The use of these random data patterns considerably reduces the volume of stored bits on a tester, thereby significantly simplifying and reducing the cost of testing the DUTs.

BIST also uses signature analyzers to compress the test results into a single, smaller pattern or "signature" to reduce the amount of tester memory and circuitry required. The signature is then analyzed to determine whether the DUT is free of structural defects. For BIST, the random pattern generator and the signature analyzer circuitry are both built right into the DUT itself. This eliminates the need for using an external tester to test the DUT.

However, the random data patterns applied (applying data patterns means applying 0's and 1's to energize various parts of circuitry in the DUT) to test the DUT should not damage the device due to a burnout. Devices are generally designed to operate in response to functional patterns, and the application of random data patterns can set up electrically undesirable configurations. For example it is possible that multiple drivers on the same circuit node are turned on, creating an electrical short circuit from the power supply to ground (when applying random data patterns during a test mode, it is possible that some state elements in the scan chain are joined together creating an electrical short circuit from the power supply to ground). This configuration, also referred to as "bus contention", can potentially result in burnout or reliability issues in the DUT (this joining of state elements to cause an electrical short circuit is referred to as "bus contention" problems). Such configurations are generally ruled out by design in the functional mode, but it is extremely difficult and expensive to guarantee that they will not arise during the application of random data patterns.

Another problem generally associated with BIST is that some of the state elements in the scan chain could be in a critical path, and they can cause a significant delay in a signal propagating through these state elements (serially coming in and out of these state elements in the scan chain) during the test mode, and this may not be acceptable. To circumvent this problem, these state elements may not be scanned (configured to be part of a serial shift register in test mode). Not scanning a state element results in a loss of control over the value at its output node (nodes are generally a specific kind of state element) during a test, when random data patterns are being shifted into the scanned elements. This can result in a non-deterministic (unpredictable) value at the output node of the non-scan state element. The resulting non-deterministic value at the output node is generally referred to as "X-generation". For example, in an adder, let us assume that we are adding two 32-bit entities which produces one 33-bit quantity. During this process, if we exclude scanning one of the inputs to the adder (say we exclude one 32-bit quantity), because this bit is in the critical path, and can cause significant delay during testing, this can result in some of the bits in the final test result to be unknown values. Suppose we are adding 3+2=5 in the adder;in a binary representation is 11, and 2 in a binary representation is 10. If one of them is in the critical path, and if we decide not to scan one of the two-bit entities when we are adding these two-bit entities, we may get an X0 as the output instead of 10. This unknown value generated during adding is referred to as the "X-generation." One way to circumvent this problem is to do the functional testing on these unscanned state elements that are in the critical path. Doing functional testing on some state elements generally requires modifying a design of the DUT circuitry, and it can result in significant delay and undue penalty in terms of final performance of the integrated circuit devices (adding this additional circuitry to test the DUT is generally referred to as "design for testability overhead", also referred to as "DFT overhead"). Generally, for a structural testing to succeed, all of the internal state/storage elements must be considered in the scan chain. Leaving some elements out in the test mode can result in lack of controllability and observability.

Therefore there is a need for a structural test that can circumvent bus contention problems and X-generation problems during testing of a DUT, and that yet can provide the advantages of random pattern testing such as collateral test coverage, reduced DFT overhead, controllability and observability of the DUTs during testing.

DETAILED DESCRIPTION

Figure 1:
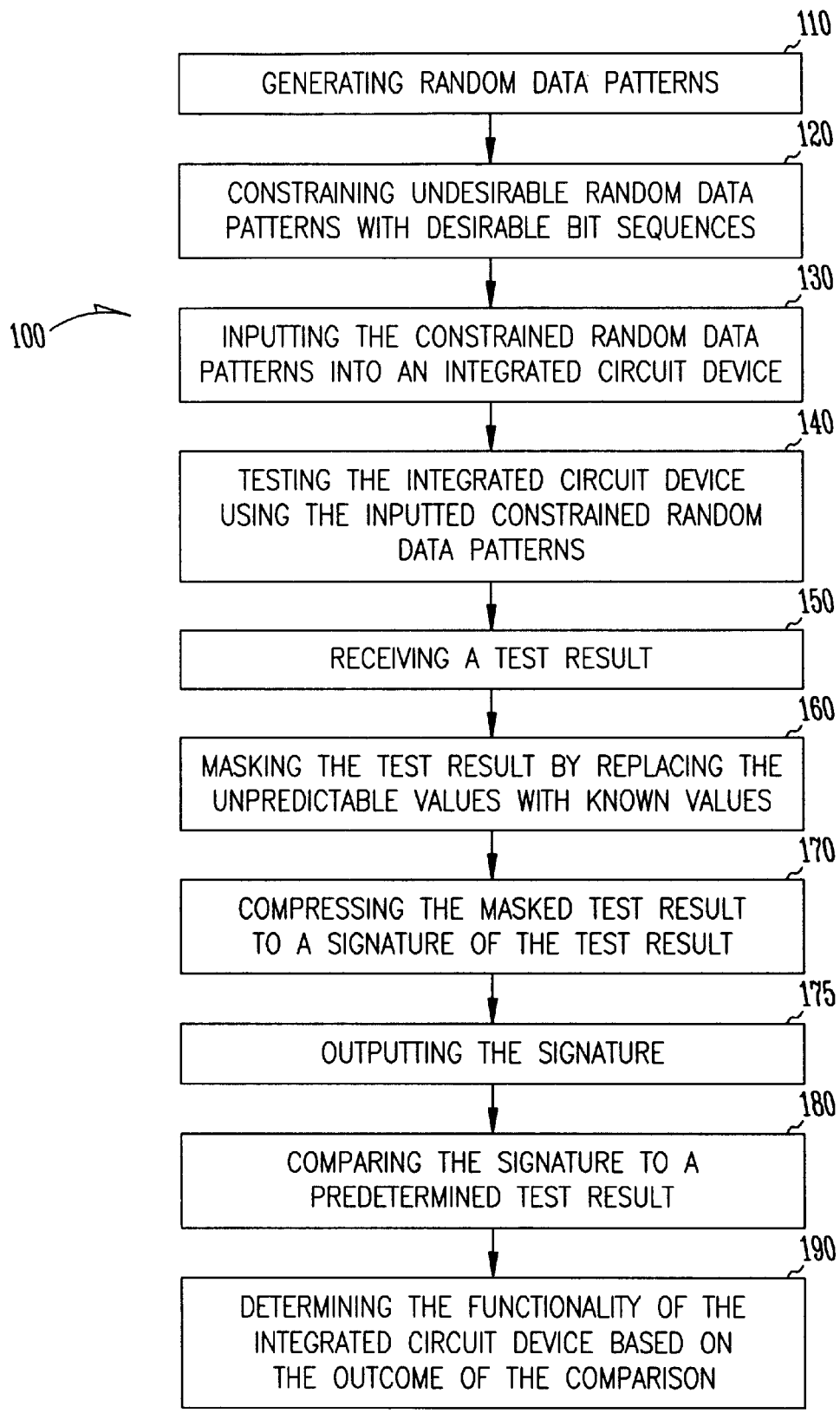
FIG. 1 is a flow diagram of one embodiment of the present invention.

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice embodiments of the invention. Other embodiments may be utilized, and structural, logical, and electrical changes may be made without departing from the scope of the present disclosure. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of embodiments of the present invention is defined only by the appended claims, along with the full scope of equivalents to which such claims are entitled.

Embodiments of the present invention provide a method and apparatus for structurally testing DUTs to avoid the bus contention problems and the X-generation problems generally associated with BIST methodology of testing the integrated circuit devices. For one embodiment, a pattern generator, a constraint checker and corrector module, an X masking module, and a signature analyzer are incorporated into an external tester to circumvent the bus contention and the X-generation problems associated with the BIST methodology of testing DUTs. In another embodiment, the X masking module and the signature analyzer are incorporated into an integrated circuit die to circumvent the bus contention and the X-generation problems.

FIG. 1 is a flow diagram, illustrating generally, by way of example, but not by way of limitation, one embodiment of a method 100 of structurally testing a DUT. Method 100 begins in action 110 by generating random data patterns for testing the DUT. In one embodiment, random data patterns are random within a test sequence, and repeats itself for every other test sequence.

The next action 120 includes constraining undesirable random data patterns in the generated random data patterns with desirable bit sequences to eliminate bus contention problems. In one embodiment, this action includes inspecting the generated random data patterns for any state elements that could set up an electrical short circuit between power supply and ground, which could in turn potentially lead to a burnout of a DUT during testing. In one embodiment, this action includes separating these state elements having bus contention problems (undesirable random data patterns) found during the inspection of the generated random data patterns, and replacing the separated undesirable random data patterns with the harmless or desirable bit sequences (bit sequences having no bus contention problems) to eliminate bus contention problems in the generated random data patterns.

The next action 130 in the method involves inputting the constrained random data patterns into the DUT for testing the DUT. The DUT can be any type of integrated circuit die, or a packaged component including circuitry such as a microprocessor Actions 140 and 150 in the method may include testing the DUT using the inputted constrained random data patterns and receiving the test result.

The next action 160 in the method 100 can include masking the outputted test result by replacing any unpredictable bit values in the outputted test result with predictable bit values to control the outcome of the test result to a predictable test result. In one embodiment, the process of masking includes inspecting the test result for the unpredictable bit values generated due to the X-generation problems (unpredictable bit values are generated when some state elements in the scan chain are not scanned because these state elements may be in a critical path and can cause significant delay during testing). Then the next action in the process includes separating any unpredictable bit values found during the inspection of the test result, and replacing them with predictable bit values in the test result. This type of replacing the unpredictable bit values with predictable bit values is generally referred to as "X-masking."

Action 170 in the method includes compressing the X-masked test result to output a single, smaller pattern or "signature" of the test result. In one embodiment, the signature can be one or more bit values. For example, the test result may include a number of 24-bit sequences of data, which could be compressed into a single, 12–24 bit signature. Generally, the bit values can be in the range of about 12 to 64. Then the next step 175 in the process involves outputting the signature.

Action 180 in the method includes comparing the outputted signature with a predetermined test result. The predetermined test result is a calculated response. In one embodiment, the predetermined test result is one or more predetermined bit values. It can also be envisioned, that the action 180 be performed after the action 160. In this embodiment, the action 180 includes comparing the masked test result with the predetermined test result.

Action 190 in the method determines the functionality of the DUT based on an outcome of the comparison.

Figure 2:
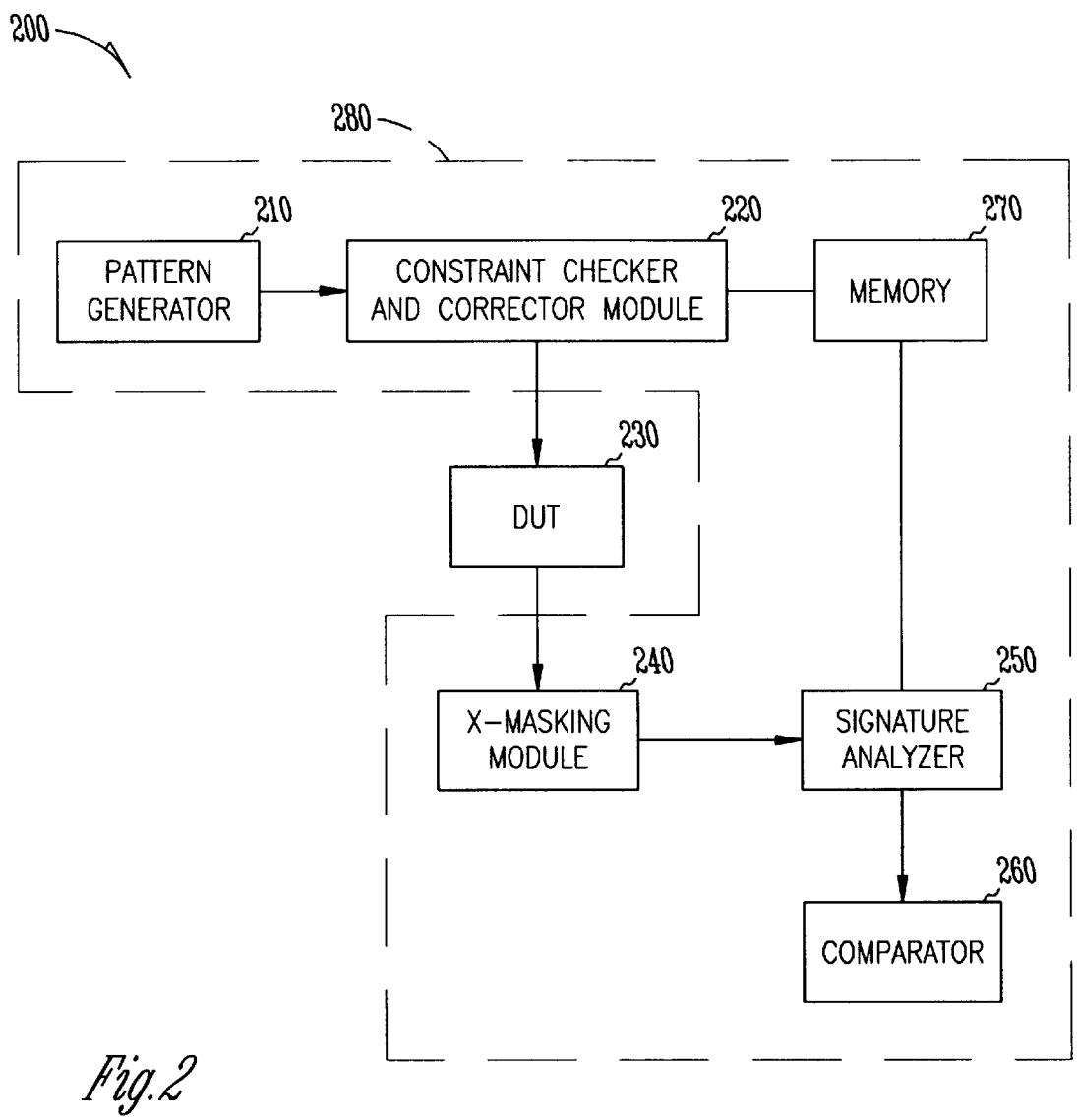
FIG. 2 is a block diagram of one embodiment of the present invention.

FIG. 2 is a block diagram, illustrating generally, by way of example, but not by way of limitation, one embodiment of a system 200 for structurally testing an integrated circuit device according to the present invention. This is accomplished in this embodiment, by using a pattern generator 210 to generate random data patterns for testing the integrated circuit device. The random data patterns can also be a pseudo random data pattern.

A constraint checker and corrector module 220 is coupled to the pattern generator 210. In one embodiment, the constraint checker and corrector module 220 receives the random data patterns generated by the pattern generator 210, and it inspects the received random data patterns for any undesirable random data patterns in the generated random patterns that can cause bus contention problems, and it replaces any undesirable random data patterns found in the generated random data patterns with desirable bit sequences to eliminate bus contention problems. When the pattern generator is included in an external tester 280 (as compared to including the pattern generator in the integrated circuit die), the size of the die can become smaller, can reduce the design effort (it is generally difficult to design a chip to avoid bus contention problems during testing using random data patterns), can eliminate the need to fix bus contention problems during design, and hence can significantly reduce the cost of designing the integrated circuit device. The pattern generator 210 and the constraint checker and corrector module 220 can be programmable logic devices, and they can be envisioned to be incorporated into an external tester 280. It can also be envisioned that the external tester 280 can be incorporated into a personal computer. Also it can be envisioned that the pattern generator 210 and the constrained checker and corrector module 220 can be incorporated into an integrated circuit die, or into a combination of the external tester 280 and the integrated circuit die. This can significantly increase the size of the die.

A DUT 230 is coupled to the constraint checker and corrector module 220 to receive the constrained random data patterns. The DUT can be an integrated circuit die, or a packaged component including circuitry such as a microprocessor.

The system for structurally testing an integrated circuit device 200 further includes an X-masking module 240 coupled to the DUT 230 to receive a test result from the DUT. In one embodiment, the X-masking module 240 inspects the test result for unpredictable values (unpredictable values can be identified by tracing back the received test result for any unscanned state elements) generated due to any X-generation problems present in the test result, and it replaces any unpredictable values found during inspection with predictable values in the test result. Generally the unpredictable values are replaced with predictable values. This makes the test result predictable by eliminating the unpredictability caused by the unpredictable values in the test result. In one embodiment, the X-masking module 240 is formed using a plurality of shift register latches. The X-masking module 240 can also be a programmable logic device incorporated into the external tester 280.

A signature analyzer 250 is coupled to the X-masking module 240 to receive the masked test result from the X-masking module 240 and compress the received masked test result (generally millions of bits of data) and output a signature of the test result. In one embodiment, the signature can be one or more bit values. For example, the test result may include a number of 24-bit sequences of data, which could be compressed into a single, 12-bit signature. Generally, the bit values can be in the range of about 12 to 64 bits. In one embodiment, the signature analyzer 250 is formed using a plurality of shift register latches. In another embodiment, the signature analyzer 250 is a programmable logic device incorporated into the external tester 280. The signature analyzer 250 and the X-masking module 240 can be incorporated as a single module into the external tester 280. By incorporating the X-masking module and the signature analyzer 250 into an external tester 280, the size of the die can become smaller, which can in turn reduce the design effort and hence reduce the cost of designing the integrated circuit device. It can also be envisioned that the external tester including the X-masking module 240 and the signature analyzer 250 can be incorporated into a personal computer. Also, it can be envisioned that the X-masking module and the signature analyzer can be incorporated into the die itself. This can significantly increase the size of the integrated circuit die.

A comparator 260 is coupled to the signature analyzer 250 to receive the signature from the signature analyzer 250. The comparator 260 compares the received signature with a predetermined test result and classifies the functionality of the DUT 230 based on an outcome of the comparison. The predetermined test result can be a calculated response. In one embodiment, the predetermined response can be one or more predetermined bit values. The system for structurally testing an integrated circuit device 200 further includes a memory 270 coupled to the constraint checker and corrector module 220 and to the signature analyzer 250 to store test algorithm instructions and the test results.

The above-described test method and apparatus provide, among other things, a test system that reduces the bus contention problems and the X-generation problems generally associated with the BIST methodology, and that yet retains advantages of the BIST methodology for structurally testing an integrated circuit device. In one embodiment, this is accomplished by incorporating a pattern generator, a constraint checker and corrector module, an X-masking module, and a signature analyzer into an external tester to eliminate bus contention problems and X-generation problems.

It is to be understood that the above description is intended to be illustrative, and not restrictive. Many other embodiments will be apparent to those of skill in the art upon reviewing the above description. The scope of embodiments of the invention should, therefore, be determined with reference to the appended claims, along with the full scope of equivalents to which such claims are entitled.

What is claimed is:

1. A method of structurally testing an integrated circuit device, comprising:

generating random data patterns externally to the integrated circuit device;

constraining undesirable random data patterns in the generated random data patterns with desirable bit sequences; and inputting the constrained random data patterns into the integrated circuit device for testing the integrated circuit device.

2. The method of claim 1, which further comprises:

testing the integrated circuit device using the inputted constrained random data patterns; and receiving a test result.

3. The method of claim 2, which further comprises:

comparing the received test result to a predetermined test result.

4. The method of claim 3, which further comprises:

determining whether the integrated circuit device is functioning properly based on an outcome of the comparison.

5. The method of claim 4, which further comprises:

masking the received test result by replacing unpredictable bit values in the test result with predictable bit values to control the outcome of the test result to a predictable test result;

compressing the masked test result to a signature of the test result; and outputting the signature.

6. The method of claim 5, which further comprises:

comparing the signature with a predetermined test result.

7. The method of claim 6, which further comprises:

determining whether the integrated circuit device is functioning properly based on an outcome of the comparison.

8. The method of claim 6, wherein the predetermined test result is a calculated response.

9. A method of structurally testing an integrated circuit device comprising:

generating random data patterns for testing the integrated circuit device;

inspecting the generated random data patterns for undesirable random data patterns that can cause bus contention problems;

separating the undesirable random data patterns found during the inspection of the generated random data patterns;

replacing the separated undesirable random data patterns with desirable bit sequences to obtain constrained random data patterns;

inputting the constrained random data patterns into the integrated circuit device for testing the integrated circuit device;

testing the integrated circuit device using the inputted constrained random data patterns;

receiving a test result;

masking the received test result by replacing unpredictable bit values in the test result with predictable bit values to control the outcome of the test result to a predictable test result;

compressing the masked test result to a signature of the test result;

outputting the signature;

comparing the signature with a predetermined test result; and determining whether the integrated circuit device is functioning properly based on an outcome of the comparison.

10. A method of structurally testing an integrated circuit device comprising:

generating random data patterns for testing the integrated circuit device;

constraining undesirable random data patterns in the generated random data patterns with desirable bit sequences;

inputting the constrained random data patterns into the integrated circuit device for testing the integrated circuit device;

testing the integrated circuit device using the inputted constrained random data patterns;

receiving a test result;

inspecting the test result for unpredictable bit values generated due to X-generation problems in the test result;

separating the unpredictable bit values found during the inspection of the test result for the unpredictable bit values;

replacing the separated unpredictable bit values in the test result with predictable bit values to obtain a masked test result;

compressing the masked test result to a signature of the test result;

outputting the signature;

comparing the signature with a predetermined test result; and determining whether the integrated circuit device is functioning properly based on an outcome of the comparison.

11. The method of claim 1, wherein the integrated circuit device is a microprocessor.

12. The method of claim 1, wherein the generated random data patterns comprise a sequence of test data patterns.

13. A method of testing an integrated circuit device comprising:

generating constrained random data patterns by constraining undesirable random data patterns in generated random data patterns with desirable bit sequences;

inputting the constrained random data patterns into the integrated circuit device;

testing the integrated circuit device using the constrained random data patterns;

receiving a test result;

inputting the received test result into a signature analyzer;

compressing the test result by masking unpredictable bit values with predictable bit values in the test result and outputting a signature of the test result;

comparing the signature to a predetermined test result; and determining whether the integrated circuit device is functioning properly based on an outcome of the comparison.

14. The method of claim 13, wherein the integrated circuit device comprises a microprocessor.

15. The method of claim 13, wherein the predetermined test result is a calculated response.

16. The method of claim 13, wherein the signature comprises one or more bit values.

17. A system for structurally testing an integrated circuit device comprising:

an external pattern generator to generate successive random data patterns; and an external constraint checker and corrector module, coupled to the pattern generator, to constrain undesirable random data patterns in the generated random data patterns with desirable bit sequences.

18. The system of claim 17, further comprising:

an integrated circuit device including circuitry, coupled to the constraint checker and corrector module, to receive the constrained random data pattern and to output a test result.

19. A system for structurally testing an integrated circuit device comprising:

an external pattern generator to generate successive random data patterns;

an external constraint checker and corrector module, coupled to the pattern generator, to constrain nodes/elements in the random data pattern generated by the pattern generator;

an integrated circuit device including circuitry, coupled to the constraint checker and corrector module, to receive the constrained random data pattern and to output a test result;

an X-masking module, coupled to the integrated circuit device, to mask the outputted test result from the integrated circuit device by replacing any unpredictable bit values with predictable bit values in the test result; and a signature analyzer, coupled to the X-masking module, to compress the masked test result into a signature.

20. The system of claim 19, which further comprises a comparator, coupled to the signature analyzer, to compare the signature to a predetermined test result and to classify the integrated circuit device based on an outcome of the comparison.

21. The system of claim 19, wherein the predetermined test result is a calculated response.

22. The system of claim 21, wherein the calculated response comprises one or more predetermined bit values.

23. The system of claim 19, wherein the pattern generator, the constraint checker and corrector module, the X-masking module, and the signature analyzer comprise programmable logic devices.

24. The system of claim 23, wherein the programmable logic devices are incorporated into an external tester.

25. The system of claim 23, wherein the programmable logic devices are incorporated into a personal computer.

26. The system of claim 23, wherein the programmable logic devices are incorporated into the integrated circuit device.

27. The system of claim 19, wherein the signature analyzer and the X-masking module are formed from a plurality of shift register latches.

28. The system of claim 19, wherein the signature analyzer comprises a serial signature analyzer.

29. The system of claim 19, further comprising a memory to store test algorithm instructions and test results.

30. The system of claim 19, wherein the random data patterns are pseudo random data patterns.

31. The system of claim 19, wherein the integrated circuit device comprises a microprocessor.

* * * * *

UNITED STATES PATENT AND TRADEMARK OFFICE
CERTIFICATE OF CORRECTION

PATENT NO. : 6,510,398 B1
DATED : January 21, 2003
INVENTOR(S) : Sandip Kundu, Sanjay Sengupta and Rajesh Galivanche It is certified that error appears in the above-identified patent and that said Letters Patent is hereby corrected as shown below:

Column 4,
Line 37, delete "," after "envisioned".

Signed and Sealed this

Twenty-first Day of June, 2005

JON W. DUDAS
*Director of the United States Patent and Trademark Office*